(12) United States Patent
Farrow et al.

(10) Patent No.: US 7,760,504 B2
(45) Date of Patent: *Jul. 20, 2010

(54) APPARATUS, SYSTEM, AND METHOD FOR THERMAL CONDUCTION INTERFACING

(75) Inventors: Timothy S. Farrow, Cary, NC (US); Dean F. Herring, Youngsville, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/186,363

(22) Filed: Aug. 5, 2008

(65) Prior Publication Data

US 2008/0285235 A1 Nov. 20, 2008

Related U.S. Application Data

(62) Division of application No. 11/343,673, filed on Jan. 31, 2006.

(51) Int. Cl.
*H05K 7/20* (2006.01)
*H01L 23/467* (2006.01)

(52) U.S. Cl. .................. 361/704; 361/705; 361/709; 361/679.54; 165/80.2; 165/80.3; 165/104.15; 165/104.16; 508/161; 508/172

(58) Field of Classification Search ......... 361/702–712, 361/715–724; 257/706–727; 174/15.1, 16.3, 174/252; 165/46, 80.3, 80.4, 104.33, 185, 165/186, 104.19; 508/161, 172
See application file for complete search history.

(56) References Cited

U.S. PATENT DOCUMENTS

| | | | | |
|---|---|---|---|---|
| 3,586,102 A | * | 6/1971 | Gilles | .................. 165/186 |
| 4,092,697 A | * | 5/1978 | Spaight | .................. 361/718 |
| 4,563,375 A | | 1/1986 | Ulrich | |
| 4,997,032 A | | 3/1991 | Danielson et al. | |
| 5,021,494 A | | 6/1991 | Toya | |
| 5,057,903 A | | 10/1991 | Olla | |
| 5,098,609 A | * | 3/1992 | Iruvanti et al. | .............. 252/511 |
| 5,313,362 A | * | 5/1994 | Hatada et al. | ................ 361/709 |
| 5,411,077 A | | 5/1995 | Tousignant | |
| 5,438,477 A | * | 8/1995 | Pasch | ......................... 361/689 |
| 5,608,610 A | | 3/1997 | Brzezinski | |
| 6,174,841 B1 | * | 1/2001 | Yamada et al. | .............. 508/172 |
| 6,255,257 B1 | * | 7/2001 | Yamada et al. | .............. 508/172 |
| 6,475,962 B1 | * | 11/2002 | Khatri | ........................ 508/161 |
| 6,496,373 B1 | * | 12/2002 | Chung | ........................ 361/705 |
| 6,632,780 B2 | * | 10/2003 | Uematsu et al. | ............. 508/155 |

(Continued)

*Primary Examiner*—Michael V Datskovskiy
(74) *Attorney, Agent, or Firm*—Kunzler Needham Massey & Thorpe

(57) ABSTRACT

An apparatus, system, and method are disclosed for thermal conduction interfacing. The system for thermal conduction interfacing is provided with a first layer formed substantially of a pliable thermally conductive material. The system includes a second layer formed substantially of a pliable thermally conductive material and coupled at the edges to the first layer forming a pliable packet, wherein the first layer and the second layer conform to a set of thermal interface surfaces. Additionally, the system includes a plurality of thermally conductive particles disposed within the packet, wherein thermal energy is transferred from the first layer to the second layer through the thermally conductive particles. Beneficially, such a system would provide effective thermal coupling between a heat generating device and a heat dissipating device. Additionally, the system would be modular, reusable, and easy to install or replace without a significant mess.

20 Claims, 6 Drawing Sheets

U.S. PATENT DOCUMENTS

| | | |
|---|---|---|
| 6,651,736 B2 | 11/2003 | Chin et al. |
| 6,657,297 B1 | 12/2003 | Jewram et al. |
| 6,690,578 B2 | 2/2004 | Edelmann |
| 6,797,382 B2 | 9/2004 | Nguyen et al. |
| 6,984,888 B2 * | 1/2006 | Sung .......................... 257/720 |
| 7,063,127 B2 * | 6/2006 | Gelorme et al. ............ 165/80.2 |
| 7,404,853 B2 * | 7/2008 | Kendall ...................... 106/403 |
| 2002/0086600 A1 * | 7/2002 | Ghosh ........................ 442/229 |
| 2007/0097651 A1 * | 5/2007 | Canale et al. ............... 361/704 |

* cited by examiner

APPARATUS, SYSTEM, AND METHOD FOR THERMAL CONDUCTION INTERFACING

CROSS-REFERENCE TO RELATED APPLICATIONS

This application is a divisional application and claims priority to U.S. patent application Ser. No. 11/343,673 entitled "Apparatus, System, and Method for Thermal Conduction Interfacing" and filed on Jan. 31, 2006 for Timothy S. Farrow, et al., which is incorporated herein by reference.

FIELD OF THE INVENTION

This invention relates to dissipation of thermal energy generated by an electronic component and more particularly relates to thermal conduction interfacing.

BACKGROUND

One of the primary problems encountered in electronics design is excess thermal energy generated by inefficiencies in the electronic components. For example, as current flows through electric circuitry, some of the electric energy is converted to thermal energy through inefficiencies in the circuit components. Unless the excess thermal energy is dissipated, the electronic components may become increasingly inefficient. The increased inefficiency generates additional thermal energy, and the cycle continues until the component fails.

For example, in an electrical transistor, heat is generated as current flows from one gate of the transistor to another. The heat is generated by inefficiencies in the transistor. Such inefficiencies may include impurities in the silicon, imperfect electron doping, and certain inefficiencies are unavoidably inherent in the device structure and material. As heat is generated, the transistor becomes more and more inefficient, and may eventually fail due to a thermally induced current runaway.

Heat issues are particularly critical in microelectronic circuit packages, such as computer processor chip packages. These microelectronic circuit packages may contain thousands of transistors and other electronic components within a confined space. Additionally, these circuits are typically enclosed in a single chip package for protection and modularity. Consequently, these processor chip packages may reach temperatures of well over 100 degrees Fahrenheit within minutes of operation. Obviously, without a highly efficient method of dissipating the heat generated in such circuits, these microelectronic chip packages would fail to operate properly.

Electronics designers have implemented several different methods of heat dissipation in electronic components. These methods include the use of fans and enclosure venting, heatsink devices, liquid cooling, and the like. However, improvements in electronic technology make possible higher processing speeds and more components within a smaller space. These improvements, while beneficial, complicate the task of heat dissipation. Many of the smaller components are more sensitive to heat. Since more components can be placed in a smaller space, the heat generated is greater. Therefore, the need for improved heat dissipation is ever increasing.

Certain of the methods described above, such as heatsinks, can dissipate heat effectively, but only when installed properly and used in combination with efficient thermal coupling products. For example, a heatsink coupled directly to a processor package will not adequately dissipate heat unless thermal grease is spread between the heatsink and the processor package. Thermal grease fills the gaps between the thermal interface surfaces on the heatsink and the processor package formed by irregularities in those surfaces. Even slight irregularities in these surfaces may result in air gaps which may significantly reduce thermal coupling between the processor package and the heatsink.

The major drawback with thermal grease is that it is very messy. The grease is difficult to contain once placed in the thermal interface. The grease may run when the temperature is elevated because the viscosity of grease decreases with increased temperature. Additionally, thermal grease does not have an indefinite shelf life. Thermal grease may crust over, or become runny or separated, or become soiled by dust. Any changes in the physical properties of the thermal grease may decrease its effectiveness.

If the thermal grease spoils it must be replaced to insure the protection and proper operation of the processor. Typically, only trained technicians are able to properly change thermal grease. In general, thermal grease is not an optimal solution, because it is messy and costly to regularly replace.

From the foregoing discussion, it should be apparent that a need exists for an apparatus, system, and method that facilitate a more efficient thermal conduction interface between an electronic component and a heat dissipating device such as a heatsink. Beneficially, such an apparatus, system, and method would provide effective thermal coupling between a heat generating device and a heat dissipating device. Additionally, the apparatus, system, and method would be modular, reusable, and easy to install or replace without a significant mess.

SUMMARY OF THE INVENTION

The present invention has been developed in response to the present state of the art, and in particular, in response to the problems and needs in the art that have not yet been fully solved by currently available thermal interface products. Accordingly, the present invention has been developed to provide an apparatus, system, and method for thermal conduction interfacing that overcome many or all of the above-discussed shortcomings in the art.

The apparatus for thermal conduction interfacing is provided with a first layer formed substantially of a pliable thermally conductive material. The apparatus includes a second layer formed substantially of a pliable thermally conductive material and coupled at the edges to the first layer forming a pliable packet, wherein the first layer and the second layer conform to a set of thermal interface surfaces. Additionally, the apparatus includes a plurality of thermally conductive particles disposed within the packet, wherein thermal energy is transferred from the first layer to the second layer through the thermally conductive particles.

In one embodiment, the apparatus further comprises a mechanism for application of force on the first and second layers, the thermally conductive particles, and the thermal interface surfaces. In a certain embodiment, the mechanism further comprises rounded packet edges to provide a spring member for application of force. The first and the second layers are further configured to conform to an uneven interface surface and substantially fill air gaps between the thermal interface surfaces when force is applied.

In a further embodiment, the thermally conductive particles may be structurally compliant forming a semisolid thermally conductive structure within the packet when force is applied. Additionally, the thermally conductive particles may be structurally resilient making the apparatus reusable. The apparatus may be further configured to conduct thermal energy between the thermal interface surfaces of an electronic component package and a heatsink.

A system of the present invention is also presented for thermal conduction interfacing. In one embodiment, the system includes a heat generating device, a heat dissipating device, and a thermal conduction interface packet. In a further embodiment, the thermal conduction interface packet may include a first layer formed substantially of a pliable thermally conductive material, a second layer formed substantially of a pliable thermally conductive material and coupled at the edges to the first layer forming a pliable packet, and a plurality of thermally conductive particles disposed within the packet. Additionally, the first layer may conform to the surface of the heat generating device and the second layer may conform to the surface of the heat dissipating device. The system may be further configured to transfer thermal energy form the first layer to the second layer through the thermally conductive particles. In a particular embodiment, the heat generating device may be an electronic component package and the heat dissipating device may be a heatsink.

A method of the present invention is also presented for thermal conduction interfacing. The method in the disclosed embodiments substantially includes the steps necessary to carry out the functions presented above with respect to the operation of the described apparatus and system. In one embodiment, the method includes providing a first layer formed substantially of a pliable thermally conductive material, coupling a second layer, formed substantially of a pliable thermally conductive material, to the edges of the first layer forming a pliable packet, wherein the first layer and the second layer conform to a set of thermal interface surfaces, and inserting a plurality of thermally conductive particles into the packet, wherein thermal energy is transferred from the first layer to the second layer through the thermally conductive particles.

The method also may include applying a perpendicular force to the thermal interface surfaces and the packet, wherein the first and second layer are further configured to conform to an uneven interface surface and substantially fill air gaps between the thermal interface surfaces when force is applied. In one embodiment, the method includes transferring thermal energy through a semisolid thermally conductive structure formed within the packet when force is applied. The method may further include reusing the packet to facilitate efficient thermal conduction between a plurality of sets of thermal interface surfaces.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

Figure 1A:
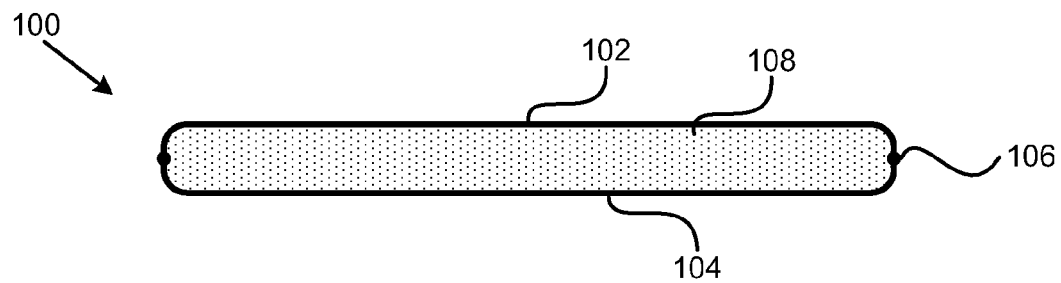
FIG. 1A is a cross-section view of an apparatus for thermal conduction interfacing token through 1-1 of FIG. 1B.

FIG. 1A depicts a cross-section view token through line 1-1 of an apparatus 100 for thermal conduction interfacing. In one embodiment, the apparatus includes a first layer 102 and a second layer 104 coupled at the edges 106 and filled with a plurality of thermally conductive particles 108. The first layer 102 and the second layer 104 may be coupled at the edges to form a packet. Alternatively, a packet may be formed of a single layer 102 or bag and coupled to itself on one edge 106.

In one embodiment, the first layer 102 and the second layer 104 are formed of a pliable thermally conductive material. In one embodiment the material is copper foil. Alternatively, the material may include thin layers of aluminum, gold, or other thermally conductive metals, and alloys thereof. In these various embodiments, the first layer 102 and the second layer 104 may be flexible, pliable, and resilient. In such embodiments, these layers 102, 104 may conform to a set of thermal interface surfaces when force is applied. The pliability and flexibility of the layers 102, 104 allow the apparatus 100 to substantially fill air gaps created by irregularities in the thermal interface surfaces. This characteristic of the apparatus 100 are described in greater detail with respect to FIG. 4B.

In one embodiment, the first layer 102 and the second layer 104 are coupled at the edges 106 to form a packet. In one embodiment, the layers 102, 104 may be coupled with an adhesive. Alternatively, the layers 102, 104 may be coupled using heat bonding, ultrasonic welding, current welding, heat welding, or the like. In an alternative embodiment, the first layer 102 and the second layer 104 may be replaced by a bag or sack structure for holding the thermally conductive particles 108.

In one embodiment, the thermally conductive particles 108 are formed of thermally conductive metal or metal alloy. For example, the thermally conductive particles 108 may be copper microspherules. Alternatively, the thermally conductive particles 108 may include gold microspherules. In another alternative embodiment, the thermally conductive particles 108 may be formed of diamond. The thermally conductive particles are in one embodiment sized between one thousandth of an inch and five thousandths of an inch in diameter of course any suitable size may be used. In another embodiment, the particles are sized in a range of between about 0.0001 inches and about 0.01 inches in diameter.

In another alternative embodiment, the thermally conductive particles 108 may include a thermally conductive fluid compound such as thermal grease or a water/helium combination.

Figure 1B:
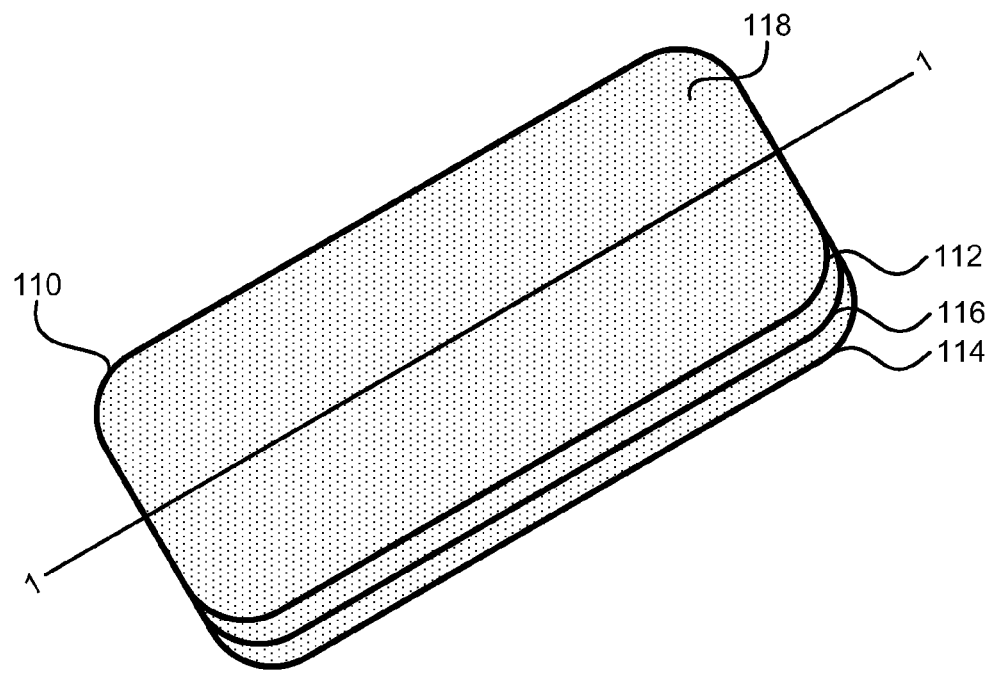
FIG. 1B is a cross-section view of an apparatus for thermal conduction interfacing token through 1-1 of FIG. 1B.

FIG. 1B depicts a cross-sectional view of a thermal conduction interface packet 110 token through line 1-1 of FIG. 1B. In one embodiment, the apparatus 100 comprises a thermal conduction interface packet 110. The thermal conduction interface packet 110 may include a first layer 112 and a second layer 114 coupled at the edges to form a thermal conduction interface packet 110. In a further embodiment, the thermal conduction interface packet includes a plurality of thermally conductive particles 118 disposed within the packet 110. In certain embodiments, the thermal conduction interface packet 110 is rectangular. Alternatively, the thermal conduction interface packet 110 may be square, circular, oval, or other shape specifically suited for the thermal interface surfaces with which the packet 110 is intended to be used.

Figure 2:
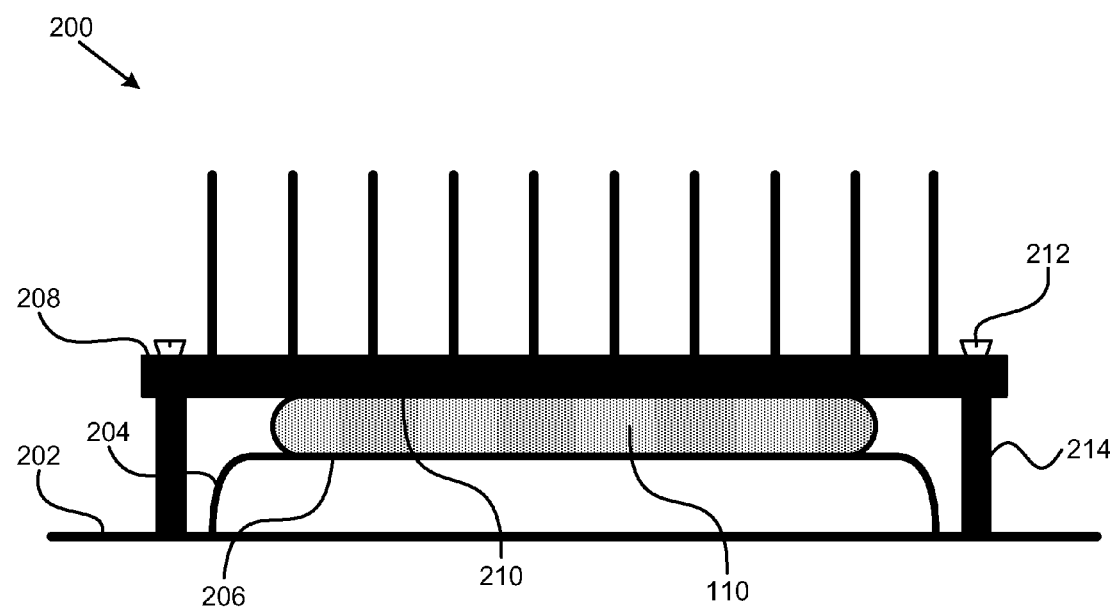
FIG. 2 is a side view of a system for thermal conduction interfacing.

FIG. 2 illustrates one embodiment of a system 200 for thermal conduction interfacing. In one embodiment, the system 200 includes a structural support base 202, such as a circuit card. Additionally, the system 200 may include a heat generating device 204, and a heat dissipating device 208. The heat generating device 204 may include a thermal interface surface 206, and the heat dissipating device 208 may include a thermal interface surface 210. Additionally, the system may include a thermal conduction interface packet 110 as illustrated in FIGS. 1A and 1B. In one further embodiment, the system 200 may include a mechanism 212, 214 for applying force on the system components.

In one embodiment, the heat generating device 204 is an electronic component package. For example, the heat generating device 204 may include a computer processor package. In alternative embodiments, the heat generating device may include high performance microelectronic circuit packages such as Digital Signal Processing (DSP) chip packages or MODEM chip packages. In a further embodiment, the heat generating device 204 may include a large scale electronic component such as a solid state RF amplifier or an electronic circuit enclosure or housing.

In one particular embodiment, the heat dissipating device 208 is a heatsink. The heatsink may include a thermal interface surface 210 and a plurality of heat dissipating fins for spreading thermal energy from the thermal interface surface 210 to the ambient air. In alternative embodiments, the heat dissipating device 208 may include a heat dissipating device which incorporates heat pipe or other liquid cooling system.

In one embodiment, the system 200 further comprises a mechanism 212, 214 for applying force perpendicular to the thermal interface surface 206 of the heat generating device 204, the thermal interface surface 210 of the heat dissipating device 208, and the thermal conduction interface packet 110. In a certain embodiment, the mechanism includes a threaded screw 212 for coupling the heat dissipating device 208 to the structural support base 202 over the area of the heat generating device 204. The threaded screws 212 may screw into threaded posts attached at predetermined positions on the structural support base 202. Additionally, the mechanism may include rounded edges on the thermal conduction interface packet 110 which may act as a spring member to facilitate application of force using the screws 212 and the posts 214. In another alternative embodiment, the screws 212 and the posts 214 may be replaced by a mounted clamp, or the like.

In one embodiment, the thermal conduction interface packet 110 may conduct thermal energy from the thermal interface surface 206 of the heat generating device 204 to the thermal interface surface 210 of the heat dissipating device 208 through a semisolid structure of thermally conductive particles 108, 118 formed when force is applied to the components of the system 200. The characteristics of the thermally conductive particles 108, 118 under force are described in further detail with relation to FIG. 3B.

Figure 3A:
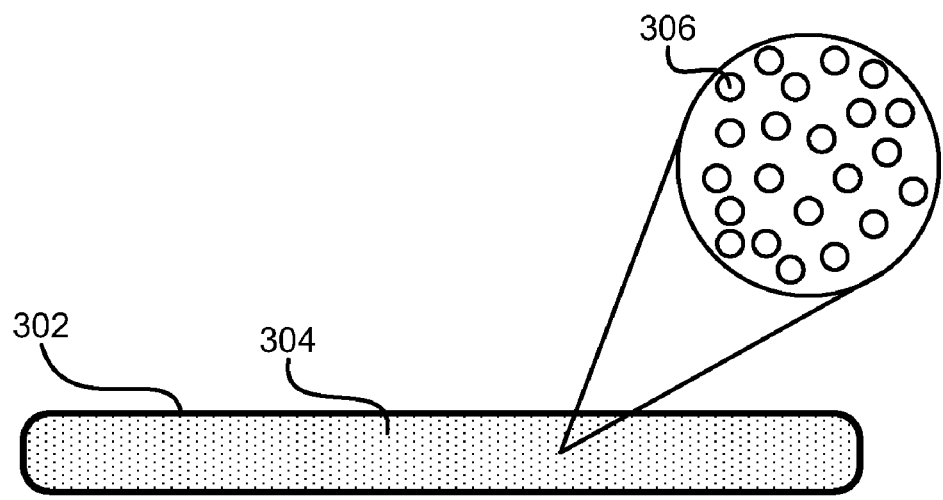
FIG. 3A is a partially enlarged cross-section view of an uncompressed thermal conduction interface packet.

FIG. 3A is a partially enlarged cross-sectional view of an uncompressed thermal conduction interface packet 302. In the depicted embodiment, the thermal conduction interface packet includes a first layer 112 and a second layer 114 coupled to form a packet 110 as depicted in FIG. 1. The thermal conduction interface packet 302 includes a plurality of uncompressed thermally conductive particles 304. In the embodiment depicted in the exploded view, each particle 306 may be a microspherule of a substantially spherical shape. The particles 306 be randomly distributed without any particular structure and may be loosely packed within the packet 302.

Figure 3B:
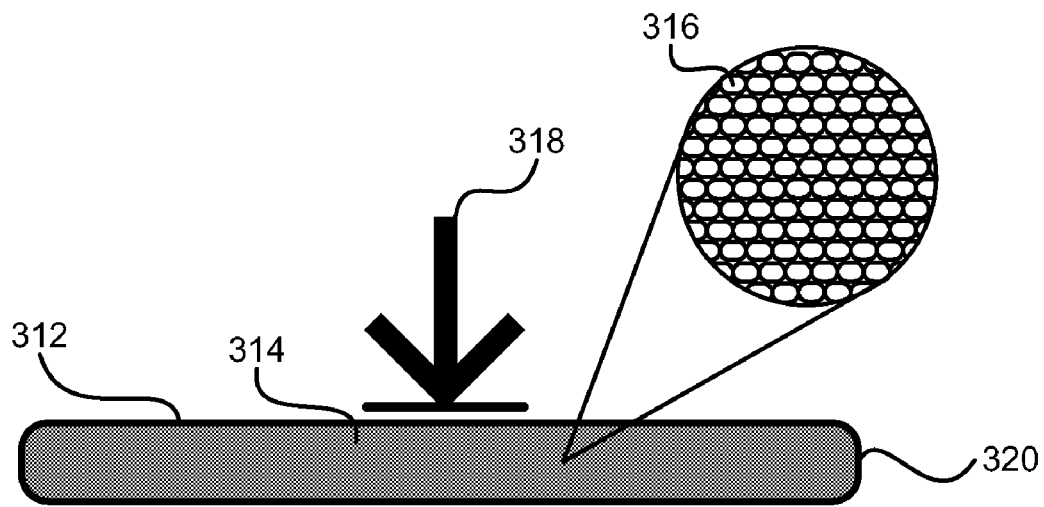
FIG. 3B is a partially enlarged cross-section view of a compressed thermal conduction interface packet.

FIG. 3B is a partially enlarged cross-sectional view of a compressed thermal conduction interface packet 312. In one embodiment, a force 318 is applied to the thermal conduction interface packet 312 compressing the thermally conductive particles 314. In certain embodiments, the edges 320 of the thermal conduction interface packet are rounded. The rounded edges allow the thermal conduction interface packet 312 to expand and retract slightly. In such an embodiment, the thermal conduction interface packet 312 acts as a spring member to facilitate application of the force 318. Some mechanism for facilitating application of the force 318 is required to compress the thermally conductive particles. The application of pressure on rigid bodies will not result in force 318 on the bodies unless there is some mechanism, such as a spring member, to facilitate application of the force 318. In an alternative embodiment, some other mechanism for facilitating application of the force 318, such as coil springs, or the like may be provided. In another embodiment, the edges 320 may be thicker than other portions of the first layer 102, and the second layer 104 to create the spring member for application of the force 318.

The exploded view of the thermally conductive particles 316 illustrate compressed particles under the force 318. In one embodiment, the particles 316 are structurally compliant. For example, the particles 316 may distort to conform to the surfaces of the other particles 316 when tightly packed. In a further embodiment, the particles 316 may pack tightly in a lattice type semisolid structure. In such an embodiment, the semisolid structure has increased thermal conductivity, because the surfaces are each conforming, one to another, and the air gaps between particles 316 are reduced. In a further embodiment, the thermally conductive particles 316 are structurally resilient, substantially returning to their original shape and distribution, as depicted by the particles 306 in FIG. 3A, when the force 318 is removed. Consequently, the thermal conduction interface packet 312 may be reusable.

Figure 4A:
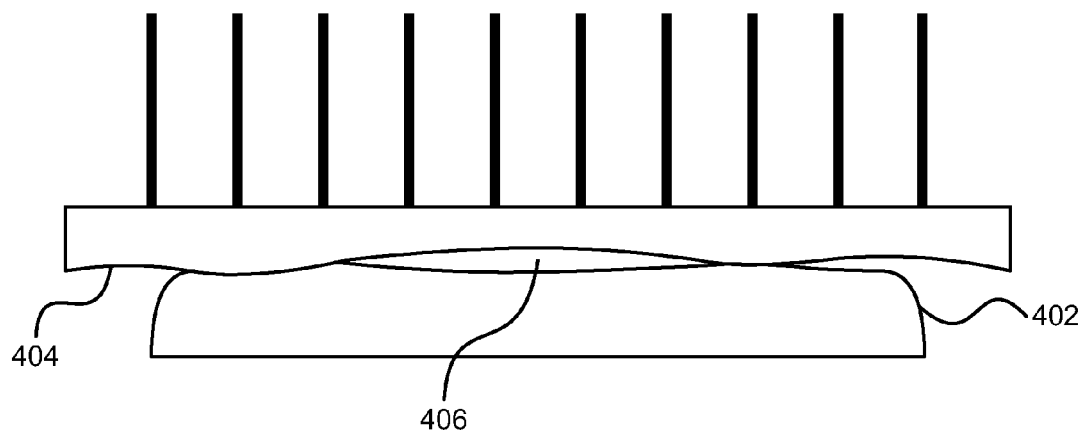
FIG. 4A is an exaggerated view of thermal interface surfaces of a heat generating device and a heat dissipating device.

FIG. 4A is an exaggerated illustration of thermal interface surfaces of a heat generating device 402 and a heat dissipating device 404. Although the irregularities would typically not be as clearly visible as depicted in this drawing, some irregularities may exist in the thermal conduction surfaces of the heat generating device 402 and the heat dissipating device 404. Irregularities may include surface bumps or voids, slight variants in the surface levels, and the like. Consequently, some portions of the conduction interface surfaces may come into contact before others. The resulting air gaps 406 may reduce thermal conduction efficiency.

Figure 4B:
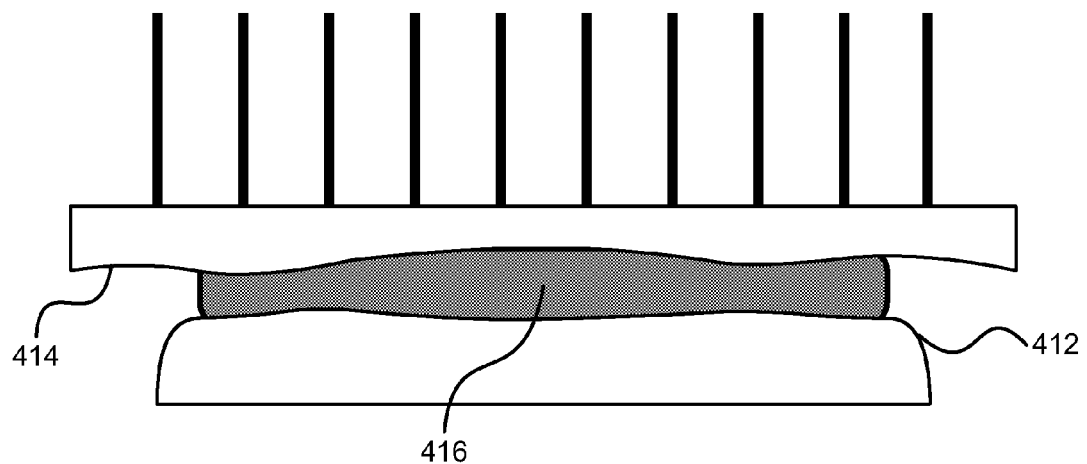
FIG. 4B is an exaggerated view of a thermal conduction interface packet implemented at the interface of the heat generating device and the heat dissipating device.

FIG. 4B is an exaggerated view of a thermal conduction interface packet 416 implemented at the interface between a heat generating device 412 and a heat dissipating device 414. In such an embodiment, the pliable surfaces of the thermal conduction interface packet 416 conform to the surfaces of the heat generating device 412 and the heat dissipating device 414 respectively. In one embodiment, thermal conduction interface packet is capable of flexibly conforming to the irregularities in the surfaces of the heat generating device 412 and the heat dissipating device 414 and substantially filling air gaps between the surfaces when force is applied. Consequently, the thermal conduction interface packet 416 may improve thermal conduction between the thermal interface surfaces of the heat generating device 412 and the heat dissipating device 414.

The schematic flow chart diagrams that follow are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Figure 5:
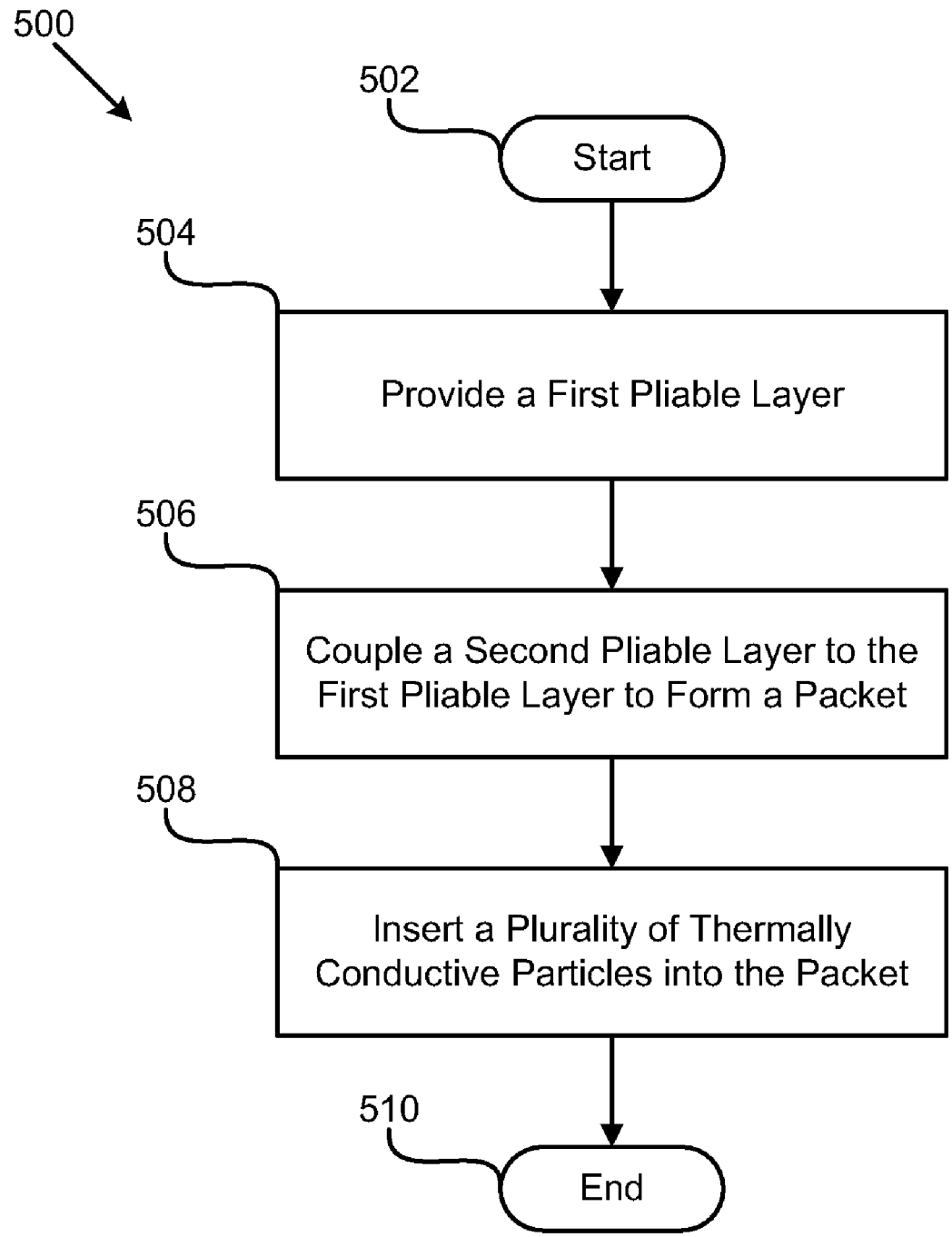
FIG. 5 is a schematic flow chart diagram illustrating one embodiment of a method for thermal conduction interfacing.

FIG. 5 illustrates one embodiment of a method 500 for thermal conduction interfacing. In one embodiment, the method starts 502 with providing 504 a first layer 102. In one particular embodiment, the first pliable layer 102 is formed substantially of a pliable thermally conductive material. In one embodiment, a second layer 104 is coupled 506 to the first layer 102. In a further embodiment, the second layer 104 is also formed substantially of a pliable thermally conductive material. Additionally, the second layer 104 may be coupled to the first layer 102 at the edges forming a pliable packet 110. The first layer 102 and the second layer 104 may be configured to conform to a set of thermal interface surfaces 206, 210. In a further embodiment, the method 500 includes inserting 508 a plurality of thermally conductive particles 108 into the packet 110. In an additional embodiment, thermal energy is transferred from the first layer 102 to the second layer 104 through the thermally conductive particles 108, and the method 500 ends 510.

For example, the method 500 may include providing 504 a first layer 102 formed substantially of a pliable copper foil. Then a second layer 104, formed substantially of a pliable copper foil, is coupled 506 at the edges to the first layer 102 forming a flexible packet 110. Then, a plurality of copper microspherules are inserted 508 within the packet 110 forming a pliable thermal conduction interface packet 110 configured to conform to the edges of a set of thermal interface surfaces 206, 210, and transfer heat from the first layer 102 to the second layer 104 through the thermally conductive particles 108.

Figure 6:
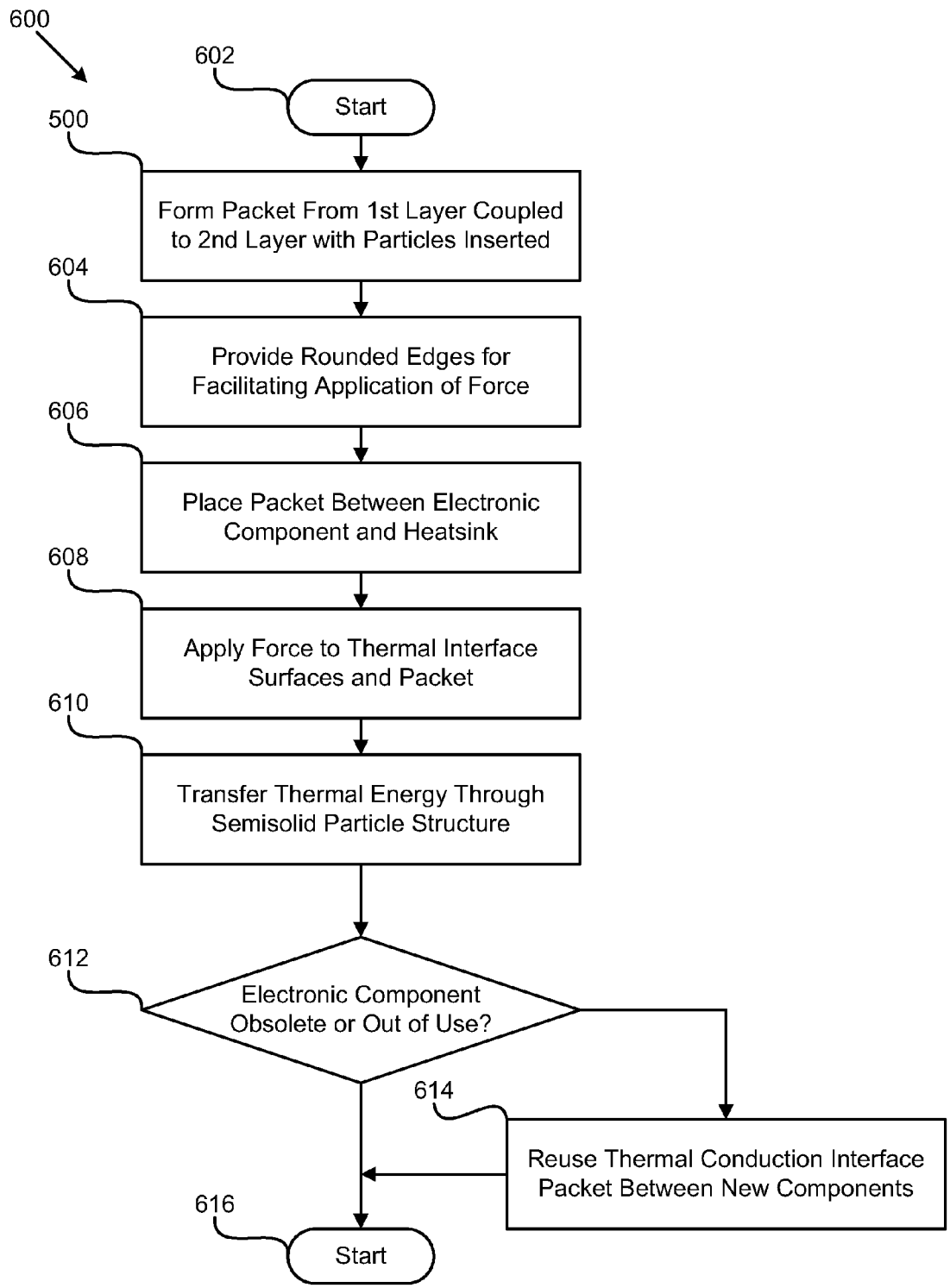
FIG. 6 is a detailed schematic flow chart diagram illustrating one embodiment of a method for implementing a thermal conduction interface packet.

FIG. 6 illustrates one embodiment of a method 600 for thermal conduction interfacing. In one embodiment, the method 600 starts 602 with forming 500 a thermal conduction interface packet 110. The method 600 may additionally include providing 604 rounded packet edges 320 for facilitating application of force 318. In a further embodiment, the method 600 includes placing 606 the thermal conduction interface packet 110 between the thermal interface surfaces 206, 210 of a heat generating device 204 and a heat dissipating device 208. In a particular embodiment, the heat generating device 204 is an electronic component package and the head dissipating device 208 is a heatsink.

The method 600 may additionally include applying 608 force 318 to the thermal interface surfaces 206, 210 and the thermal conduction interface packet 110. Then thermal energy may be transferred 610 through a semisolid particle structure created by compressed thermally conductive particles 316 within the thermal conduction interface packet 110. If it is determined 612 that the heat generating device 204 or the heat dissipating device 208 is obsolete or not needed, the thermal conduction interface packet 110 may be removed and reused 614 between a new heat generating device 204 and a new heat dissipating device 208 and the method ends 616. If it is determined 612 that the electronic components are not obsolete, the thermal interface packet 110 may remain in use throughout the lifetime of the heat generating device 204 and the heat dissipating device 208, and the method ends 616.

For example, the method 600 may include providing 500 a thermal conduction interface packet 110 in accordance with the example described with relation to FIG. 5 above. Additionally, the method 600 may include providing 604 rounded edges on the thermal conduction interface packet 110 making the packet 110 act as a spring member for facilitating the application of force 318 on the system 200. The copper thermal conduction interface packet 110 may be placed 606 between a computer system processor 204 and a heatsink device 208.

The method 600 may additionally include applying 608 a force 318 to the system 200 by applying pressure with the threaded screws 212 and the threaded posts on the components including the thermal conduction interface packet 110 with rounded edges 320 configured to act as a spring member for the system 200. When the processor chip is powered, it may transfer 610 heat from the thermal interface surface 206 through the thermal conduction interface packet 110 to the thermal interface surface 210 of a heatsink 208. If it is determined 612 that the processor 204 is obsolete or not needed, the thermal conduction interface packet 110 may be removed from the system 200 and reused 614 in a new system 200.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A system for thermal conduction interfacing, the system comprising:
    a heat generating device;
    a heat dissipating device;
    a thermal conduction interface packet comprising
        a first layer formed substantially of a pliable thermally conductive material,
        a second layer formed substantially of a pliable thermally conductive material and coupled at edges to the first layer forming a pliable packet, and
        a plurality of solid thermally conductive particles disposed within the packet, the packet comprising particles without intentionally added liquid, each particle comprising a microsphereule of a substantially spherical shape; and
    wherein the first layer conforms to the surface of the heat generating device, the second layer conforms to the surface of the heat dissipating device, the particles compress and distort to the surfaces of the other particles when force is applied to the packet forming a semisolid thermally conductive structure within the packet, and thermal energy is transferred from the first layer to the second layer through the thermally conductive particles.

2. The system of claim 1, wherein the heat generating device is an electronic component package and the heat dissipating device is a heat sink.

3. The system of claim 1, further comprising a mechanism for application of force perpendicular to the thermal interface surfaces of the heat generating device, the heat dissipating device, and the thermal conduction interface packet.

4. The system of claim 3, wherein the second layer is coupled at the edges to the first layer forming rounded edges that are thicker than other portions of the first layer and the second layer to provide a spring member for application of force within the system opposing the force provided by the mechanism.

5. The system of claim 1, wherein the thermal conduction interface packet is further configured to conform to an uneven interface surface and substantially fill air gaps between the surfaces of the heat generating device and the heat dissipating device when force is applied, wherein compression and distortion of the thermal conductive particles reduces an amount of empty space between the particles providing increased thermal conduction between the first and second layers.

6. The system of claim 1, wherein the thermally conductive particles are sized in a range between about 0.001 inches and about 0.005 inches.

7. The system of claim 1, wherein the thermally conductive particles comprise one of diamond microspherules, copper microspherules, and gold microspherules.

8. An apparatus for thermal conduction interfacing, the apparatus comprising:
    a thermal conduction interface packet comprising
        a first layer formed substantially of a pliable thermally conductive material,
        a second layer formed substantially of a pliable thermally conductive material and coupled at edges to the first layer forming a pliable packet, and
        a plurality of solid thermally conductive particles disposed within the packet, the packet comprising particles without intentionally added liquid, each particle comprising a microspherule of a substantially spherical shape; and
    wherein the first layer conforms to a surface of a heat generating device, the second layer conforms to a surface of a heat dissipating device, the particles compress and distort to surfaces of other particles when force is applied to the packet forming a semisolid thermally conductive structure within the packet, and thermal energy is transferred from the first layer to the second layer through the thermally conductive particles.

9. The apparatus of claim 8, wherein the heat generating device is an electronic component package and the heat dissipating device is a heat sink.

10. The apparatus of claim 8, further comprising a mechanism for application of force perpendicular to the thermal interface surfaces of the heat generating device, the heat dissipating device, and the packet.

11. The apparatus of claim 10, wherein the second layer is coupled at the edges to the first layer forming rounded edges that are thicker than other portions of the first layer and the second layer to provide a spring member for application of force opposing the force provided by the mechanism.

12. The apparatus of claim 8, wherein the packet is further configured to conform to an uneven interface surface and substantially fill air gaps between the surfaces of the heat generating device and the heat dissipating device when force is applied, wherein compression and distortion of the thermal conductive particles reduces an amount of empty space between the particles providing increased thermal conduction between the first and second layers.

13. The apparatus of claim 8, wherein the thermally conductive particles are sized in a range between about 0.001 inches and about 0.005 inches.

14. The apparatus of claim 8, wherein the thermally conductive particles comprise one of diamond microspherules, copper microspherules, and gold microspherules.

15. A method for thermal conduction interfacing, the method comprising:
    providing a first layer formed substantially of a pliable thermally conductive material;
    coupling a second layer, formed substantially of a pliable thermally conductive material, to edges of the first layer forming a pliable packet, wherein the first layer and the second layer conform to a set of thermal interface surfaces; and
    inserting a plurality of solid thermally conductive particles into the packet, the packet comprising particles without intentionally added liquid, each particle comprising a microsphereule of a substantially spherical shape, wherein the particles compress and distort to the surfaces of the other particles when force is applied to the packet forming a semisolid thermally conductive structure within the packet, and wherein thermal energy is transferred from the first layer to the second layer through the thermally conductive particles.

16. The method of claim 15, wherein the method further comprises placing the packet between the thermal interface surfaces of an electronic component package and a heat sink.

17. The method of claim 15, wherein the method further comprises applying a perpendicular force to the thermal interface surfaces and the packet.

18. The method of claim 15, wherein the method further comprises providing rounded packet edges that are thicker than other portions of the first layer and the second layer to act as a spring member for facilitating the application of force on the thermal interface surfaces and the packet.

19. The method of claim 15, wherein the first and the second layer are further configured to conform to an uneven interface surface and substantially fill air gaps between the thermal interface surfaces when force is applied, wherein compression and distortion of the thermal conductive particles reduces an amount of empty space between the particles providing increased thermal conduction between the first and second layers.

20. The method of claim 15, wherein the thermally conductive particles are sized in a range between about 0.001 inches and about 0.005 inches.

* * * * *